(12) United States Patent
Layer et al.

(10) Patent No.: US 7,952,113 B2
(45) Date of Patent: May 31, 2011

(54) FLAT LIGHTING DEVICE AND A METHOD FOR THE PRODUCTION THEREOF

(75) Inventors: Hans Layer, Ulm (DE); Martin Werner, Singen (DE)

(73) Assignee: Amcor Flexibles Kreuzlingen Ltd., Kreuzlingen (CH)

( * ) Notice: Subject to any disclaimer, the term of this patent is extended or adjusted under 35 U.S.C. 154(b) by 526 days.

(21) Appl. No.: 11/886,532

(22) PCT Filed: Mar. 8, 2006

(86) PCT No.: PCT/EP2006/002102
§ 371 (c)(1),
(2), (4) Date: Sep. 17, 2007

(87) PCT Pub. No.: WO2006/097225
PCT Pub. Date: Sep. 21, 2006

(65) Prior Publication Data
US 2009/0015168 A1    Jan. 15, 2009

(30) Foreign Application Priority Data
Mar. 15, 2005   (DE) .................. 10 2005 011 857

(51) Int. Cl.
*H01L 33/00* (2010.01)
(52) U.S. Cl. ............................ 257/99; 257/103; 438/20
(58) Field of Classification Search .................. 257/79, 257/88, 99, 103; 438/20
See application file for complete search history.

(56) References Cited

U.S. PATENT DOCUMENTS

| | | | | |
|---|---|---|---|---|
| 4,733,127 | A * | 3/1988 | Takasu et al. | 313/500 |
| 6,233,817 | B1 | 5/2001 | Ellis et al. | |
| 6,489,637 | B1 * | 12/2002 | Sakamoto et al. | 257/98 |
| 6,558,970 | B2 * | 5/2003 | Sakamoto et al. | 438/22 |
| 6,930,332 | B2 * | 8/2005 | Hashimoto et al. | 257/98 |
| 7,410,825 | B2 * | 8/2008 | Majumdar et al. | 438/106 |
| 7,554,112 | B1 * | 6/2009 | Lang et al. | 257/40 |
| 7,579,629 | B2 * | 8/2009 | Inoguchi | 257/98 |
| 2003/0170922 | A1 * | 9/2003 | Sakamoto et al. | 438/22 |
| 2003/0193055 | A1 | 10/2003 | Martter et al. | |
| 2004/0012958 | A1 * | 1/2004 | Hashimoto et al. | 362/241 |

FOREIGN PATENT DOCUMENTS

| | | |
|---|---|---|
| DE | 10026460 | 11/2001 |
| EP | 1020909 | 7/2000 |
| EP | 1059667 | 12/2000 |

OTHER PUBLICATIONS

Patent Abstracts Of Japan, vol. 1997, No. 3, Mar. 31, 1997.

* cited by examiner

*Primary Examiner* — Thuy Vinh Tran
(74) *Attorney, Agent, or Firm* — Fisher, Christen & Sabol

(57) ABSTRACT

A flat lighting device (10, 10') that has light-emitting lighting elements (1) arranged on a carrier, which are connected to current supply and current discharge lines (4') to supply current. The carrier has the form of a metallic sheet (2), which is covered with an insulating layer (3), on which series connections of a lighting element (3) and a surface resistor (5) are arranged between the current supply and current discharge lines (4'). One lighting element (1) and one surface series resistor (5) of a series connection and the series connections and the current supply and current discharge lines (4') are connected to one another by conductor paths. There is also a method for producing lighting devices of this type.

15 Claims, 2 Drawing Sheets

FLAT LIGHTING DEVICE AND A METHOD FOR THE PRODUCTION THEREOF

Figure 1:
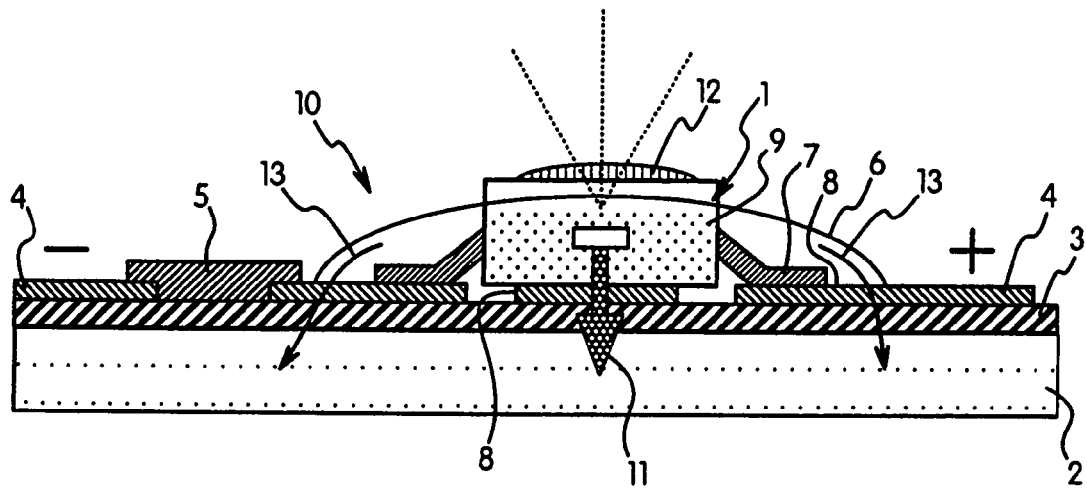

This is a 371 national stage application of International (PCT) Patent Application No. PCT/EP2006/002102, filed on Mar. 8, 2006, that has benefit of the priority of German Patent Application No. 102005011857.7, filed on Mar. 15, 2005.

The invention relates to a flat lighting device and a method for the production thereof.

Optoelectronic modules are known, in which a plurality of lighting elements are arranged on a substrate. In this case, there is a problem in that the lighting elements can only be operated with a relatively low current of about 10 to 50 mA because of heating. The quantity of light emitted by the lighting elements is therefore small.

An optoelectronic module emerges from DE 100 33 502 A1, in which light-emitting semiconductor components are fastened to a substrate which is a good conductor of heat. The underneath of the substrate is fastened to a metallic carrier body, which has a high heat capacity and good heat conductivity. The component fastening between the semiconductor components and the substrate, as well as the substrate fastening between the substrate and the carrier body, is implemented with good heat conductivity. The substrate may consist of silicon, which is a lighter and relatively economically available material and has excellent heat conductivity. The entire module is covered by a glass body, which has a recess exposing the substrate surface, in which recess the semiconductor components are arranged.

The object of the present invention is to disclose a lighting device, which has a relatively high efficiency and a long service life and, in addition, is constructed relatively simply, and a method for the production thereof.

This object is achieved by a lighting device with the features of claim 1 and by a method with the features of claim 31.

The substantial advantage of the present lighting device, which preferably has the form of a wall covering of light or a panel of light, consists in that it is particularly simply constructed and can be handled and installed like a large-area wall covering or like individual panels. The method for producing the lighting device according to the invention is also relatively simple and economical to carry out. This is to be attributed to the special structure of the lighting device according to the invention.

As the individual lighting elements or light-emitting diodes, are arranged in such a way that excellent heat transmission or dissipation takes place into the metallic carrier sheet being used as a carrier, the individual lighting elements can be operated, depending on their number, with an operating voltage of, for example, 20 V. The operating voltage is therefore in the range of small voltages according to the VDE standards. The outlay for insulation is therefore advantageously kept small.

The hard-rolled aluminium sheets being used as a carrier sheet are particularly simply and advantageously provided in a flat manner with an insulating layer, in particular with an outer layer of varnish, as an insulator, and printed by the gravure printing method in several layers with a conductive dye, preferably a silver conductive dye, to produce the various conductor paths and the connection contact faces, and also with a further conductive dye, preferably a graphite conductive dye, to produce the series resistors. This method is also particularly simple to carry out and economical. In this case, both the conductor paths being used for current supply and current removal and for current distribution in the face of the lighting device, and also the connection faces for the light-emitting components are printed on in the silver conductive dye by a gravure printing operation. As, the resistor faces of the series resistors, consisting of graphite conductive dye, which are preferably fed by input and output lines consisting of silver are also advantageously printed on by the gravure printing method, the necessary low tolerance of the series resistors is advantageously far below 10% because of the high uniformity of the gravure printing method. The required power loss of the series resistors is achieved by the relatively large-area configuration of the printed-on resistance faces. The light-emitting lighting elements are preferably bonded with a silver-containing conductive adhesive to the corresponding connection contact faces or soldered thereto. Said silver-containing conductive adhesive has a very low coefficient of heat conduction, so good heat dissipation takes place from the light-emitting lighting elements to the metallic carrier sheet.

In a preferred configuration of the invention as a wall covering of light, respective parallel branches with four or more series connections connected in series in each case consisting of a light-emitting lighting element and a series resistor are arranged between the current supply and current discharge lines to compensate the different forward characteristics of the lighting elements.

The individual light-emitting lighting elements, after they have been fastened to the corresponding connection contact faces, are advantageously further fixed and mechanically stabilised by a stabilisation coating.

As the surface of the metallic carrier sheet can be occupied practically without additional costs with conductor path structures by the gravure printing method, in a preferred configuration of the invention, additional conductor paths for potential equalisation are also printed parallel to the current supply and current discharge lines. Normally, no current flows through these potential equalisation conductor paths, as all light-emitting lighting elements, which are connected in series between a current supply line and a current discharge line, lie on the same potential. If a light-emitting lighting element fails, a cross current flows, which continues to supply the light-emitting lighting elements connected in series to the failed light-emitting lighting element with current. Thus the entire series of light-emitting lighting elements advantageously does not fail but only one light-emitting lighting element.

An important advantage of the method according to the invention is that because of the application of the conductor paths, the current supply lines, the current discharge lines, the connection contact faces, optionally the potential equalisation conductor paths and the series resistor faces by the gravure printing method in comparison to methods with etched conductor paths or with conductor paths produced by screen printing, operation can be substantially more economical, and, owing to the use of an aluminium sheet as the metallic carrier sheet, the necessary heat distribution is simultaneously achieved to dissipate and distribute the heat that has been generated pointwise of the light-emitting lighting elements into the face on the rear of the aluminium sheet.

In a further preferred configuration of the invention, the flexible metallic carrier sheet is reinforced by a stable composite part, so self-supporting light panels can be produced. Here, a composite part preferably configured in a honey-combed manner and also made of a metallic material is bonded onto the metallic carrier sheet, the opposite side being covered with an optically transparent plastics material or an opaque plastics material bringing about a diffuse light distribution. The light-emitting lighting elements, conductor paths and resistors are advantageously mechanically and electrically protected thereby and a stable sandwich element is produced with a heat-dissipating rear and a light-emitting front side, which can be lined up with other correspondingly configured sandwich elements next to each other to provide larger light faces.

Figure 3:
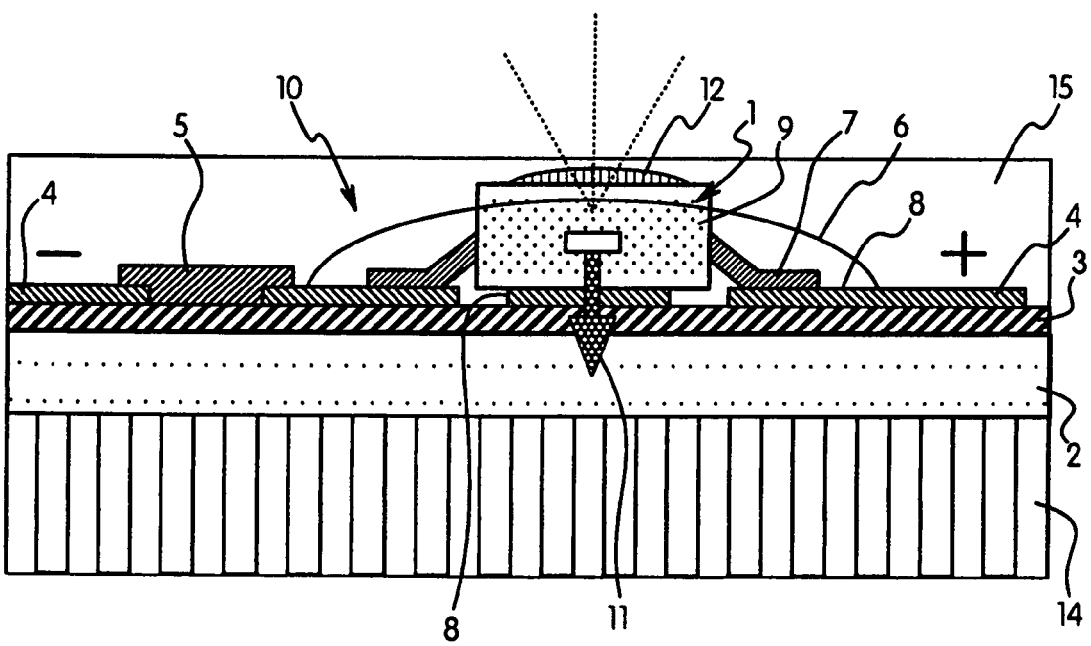
Figure 2:
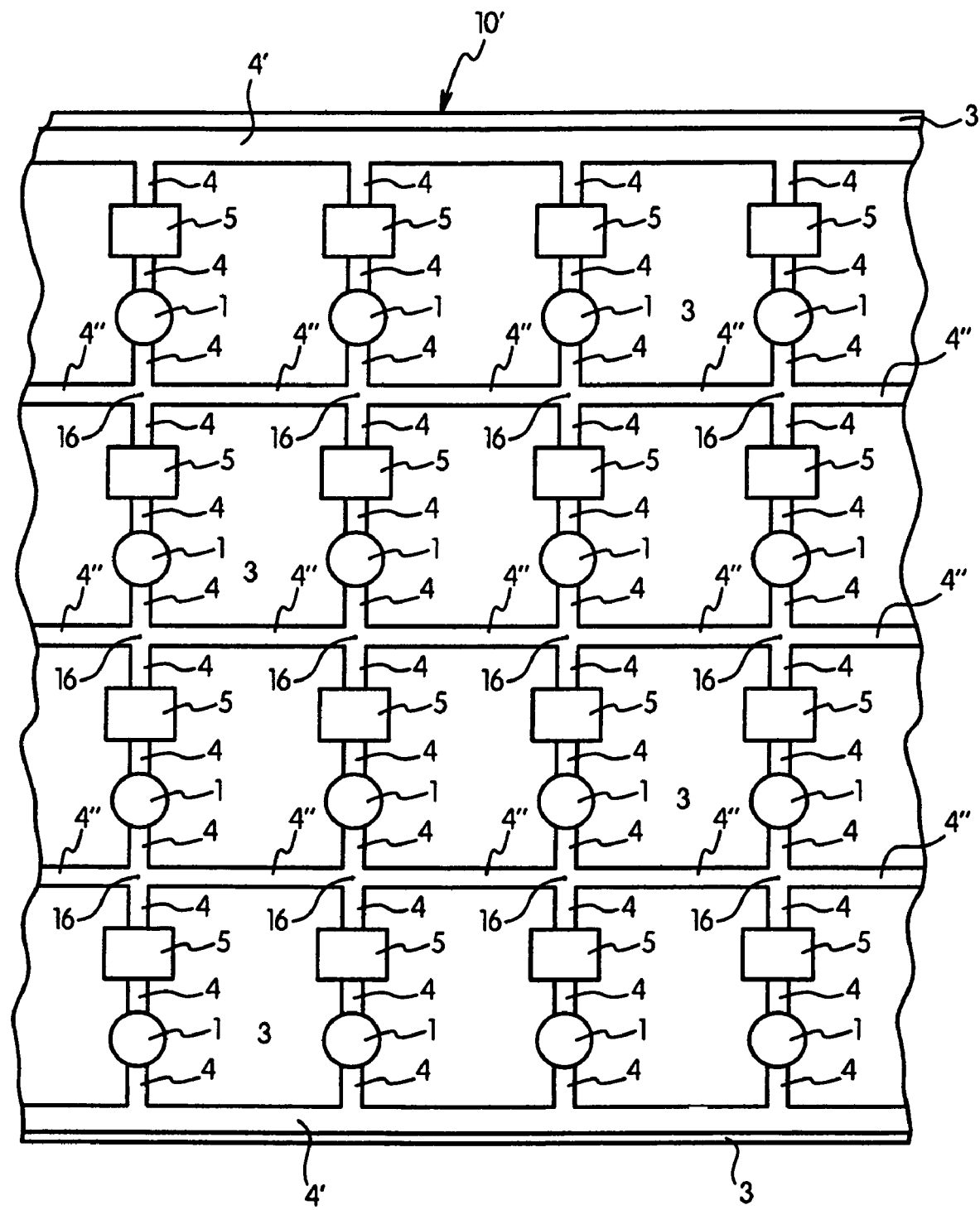

The invention and the configuration thereof are described in more detail below in conjunction with the figures, in which:

FIG. 1 shows a section through a region of a light-emitting lighting element of the lighting device according to the invention;

FIG. 2 shows a view from above onto a lighting device according to the invention which comprises a plurality of light-emitting lighting elements and is configured as a wall covering of light, to describe the arrangement of the connection contact faces and of the series resistor faces and the conductor path guidance; and FIG. 3 shows a lighting device according to the invention configured as a light panel with a sandwich construction.

According to FIG. 1, which shows a section through the region of a light-emitting lighting element 1, preferably a light-emitting diode, of a lighting device 10, the latter consists substantially of a metallic carrier sheet 2, which preferably has the form of an aluminium sheet, an insulating layer 3, which is preferably a layer of varnish, conductor paths 4, connection contact faces 8, series resistor faces 5, light-emitting diodes (LED) 1 and a stabilisation coating 6.

In the embodiment of the method according to the invention, an insulating layer 3 of varnish is firstly applied in a flat manner to the aluminium sheet 2, which is preferably hard-rolled and has a thickness of about 70 µm, the layer of varnish preferably consisting of polyurethane and being 10 µm thick. It is conceivable for the insulating layer 3 of varnish to be applied in two or more layers in order to prevent insulation defects owing to holes. It is also possible to achieve the insulation by means of a paper web or plastics material sheet laminated onto the aluminium sheet.

Various electrically conductive paths or faces, which preferably consist of conductive dyes and are used for the production of the current supply and current discharge lines 4', of the conductor paths 4 for distribution of current into the face of the lighting device 10, the connection contact faces 8 for the light-emitting diodes 1 and the series resistor faces 5, are preferably printed, in several layers, on the surface of the insulating layer 3 of varnish by the gravure printing method. The current supply and current discharge lines 4', the conductor paths 4 and the connection contact faces 8 particularly preferably consist of a silver conductive dye printed on by a gravure printing method step. The series resistor faces 5 preferably consist of a graphite conductive dye printed on in a separate gravure printing method step.

The series resistor faces 5 are produced overlapping the corresponding conductor paths 4 in the separate gravure printing method step, so good electrical connections are produced.

The connections 7 of the light-emitting diodes 1 are then fastened to the connection contact faces 8 of the conductor paths 4. For this purpose, the connections 7 are then applied in the correct position with respect to the connection contact faces 8 in an assembly process and fastened or bonded thereto with the aid of a conductive adhesive, a good electrical connection and a connection with a good heat conductivity being brought about. Alternatively, the connections 7 of the diodes 1 can also be soldered at the connection contact faces 8.

In the correct position, the heat-conductive body part 9 of the diodes 1, which preferably consists of copper, is seated on a connection contact face 8 located therebelow, so good heat dissipation from the body part 9 in the direction of the arrow 11 takes place via the conductor path 4 and the layer 3 of varnish to the aluminium sheet 2.

The connection contact faces 8 can also be formed directly by a partial region of the conductor paths 4.

To stabilise and mechanically fix the diodes 1, a stabilisation coating 6 is expediently applied to the fastening region of the diodes 1, care being taken that the diodes 1 are only embedded to such an extent into the material of the coating 6 that their light-emitting front side 12 is exposed. The stabilisation coating 6 simultaneously also covers in each case the contacts between the connections 7 of the diodes 1 and the corresponding connection contact faces 8. The application of the stabilising coating 6 is particularly advantageous because, by it, a fixed bond is produced between the diodes 1 and the aluminium sheet 2, which is rigid compared to the aluminium sheet 2 which is flexible per se. Bending radii, which are produced during the handling of the lighting device 10 by deformations, are therefore not introduced directly into the contact points, but, as shown by the arrows 13, into the aluminium sheet 2. The contact points are thus substantially relieved of pressure.

According to FIG. 2, parallel branches, arranged next to one another, run between the parallel current supply and current discharge lines 4' and, in each case, comprise a plurality (for example four) of series connections in each case of a series resistor face 5 and a diode 1 in series. The series resistor face 5 and the diode 1 of the series connections are connected to one another in each case via a conductor path 4. The series connections of a branch are also connected to one another or to the current supply and current discharge line 4' by conductor paths 4.

The points 16, arranged next to one another in the direction of the current supply and current discharge lines 4', of the conductor paths 4 of the branches, which are in each case located between two corresponding series connections of the branches, may preferably be connected to one another by potential equalisation lines 4", which run parallel to the current supply and current discharge lines 4', for the reasons mentioned at the outset.

To produce a stable lighting device 10', which can be handled as a light panel, according to FIG. 3, a preferably honeycombed metallic composite part 14 is fastened, preferably bonded, to the side of the aluminium sheet 2 remote from the diodes 1, the composite part expediently consisting of aluminium. An optically transparent cover 15 or a cover which is opaque for diffuse light distribution, preferably consisting of a plastics material can then be applied to the side of the diodes 1. A lighting device 10' in a sandwich construction with a heat-diffusing aluminium rear and a light-emitting front side is thus produced, the diodes 1, the conductor paths 4, the connection contact faces 8, the connections 7 of the diodes 1 and the series resistor faces 5 being mechanically and electrically well protected.

LIST OF REFERENCE NUMERALS 1 lighting element
2 carrier sheet
3 insulating layer
4 conductor path
4' current supply and current discharge line
4" potential equalisation line
5 series resistor face
6 stabilisation coating
7 connection
8 connection contact faces
9 body part 10 lighting device
10' lighting device
11 arrow
12 front side
13 arrow
14 composite part
15 cover
16 point

The invention claimed is:

1. A flat lighting device comprising light-emitting lighting elements arranged on a carrier, which are connected to current supply and current discharge lines to supply current, the carrier has the form of a metallic sheet (2), which is covered with an insulating layer (3), on which series connections of one lighting element (1) and one surface series resistor (5) are arranged between the current supply and current discharge lines (4'), the-one lighting element (1) and the one surface series resistor (5) of a series connection as well as the series connections and the current supply and current discharge lines (4') are connected to one another by conductor paths (4), a plurality of series connections are arranged next to one another between the current supply and current discharge lines (4'), a plurality of branches, which comprise, one behind the other, a plurality of series connections of a lighting element (1) and a surface series resistor (5) in each case, are arranged between the current supply and current discharge lines (4'), potential equalization lines (4") are provided, which in each case connect to one another the points (16), arranged next to one another, of the conductor paths (4) of the branches, which are arranged between series connections of a lighting element (1) and a surface series resistor (5), in each case, the metallic sheet (2) is an aluminum sheet, the aluminum sheet has a thickness of about 70 µm, the insulating layer (2) is formed by a paper web laminated on to the metallic sheet (2), the conductor paths (4) the current supply and current discharge lines (4') are printed onto the surface of the insulation layer (3) by a gravure printing method, the conductor paths, the current supply and current discharge lines (4') consist of a conductive dye, the conductive dye is a silver conductive dye, the surface series resistors (5) are printed onto the surface of the insulating layer (3) by the gravure printing method, the surface series resistors (5) and the conductor paths (4) are printed on so as to overlap, the surface series resistors consist of a further conductive dye, the further conductive dye is a graphite conductive dye, the connections (7) of the lighting elements (1) are in each case bonded to connection contact faces (7) which are arranged on conductor paths (4) with a conductive adhesive, or soldered, the connection contact faces (7) are printed on together with the corresponding conductor paths (4) by a gravure printing method, the lighting elements (1) are light-emitting diodes, a body part (9) of the lighting element (1) is seated on a contact connection face (8) located there below, so that good heat dissipation takes place from the body part (9) to the metallic sheet (2), and a stabilizing coating (6) is arranged on the lighting elements (1) for stabilization and for mechanical fixing thereof and also covers the regions of the connections (7) of the lighting elements (1) and of connection contact faces (8), but leaves the light-emitting front side of the lighting elements (1) free.

2. The lighting device according to claim 1, wherein a stabilizing metallic composite part (14) is fastened to a side of the metallic sheet (2) remote from the lighting elements (1).

3. The lighting device according to claim 2, wherein the composite part (14) is honeycombed.

4. The lighting device according to claim 3, wherein the composite part consists of aluminum.

5. The lighting device according to claim 4, wherein a cover (15) is fastened to the side of the lighting device opposing the composite part (14).

6. The lighting device according to claim 5, wherein the cover (15) consists of a transparent or opaque material.

7. The lighting device according to claim 6, wherein the cover (15) consists of a plastics material.

8. A flat lighting device comprising light-emitting lighting elements arranged on a carrier, which are connected to current supply and current discharge lines to supply current, the carrier has the form of a metallic sheet (2), which is covered with an insulating layer (3), on which series connections of one lighting element (1) and one surface series resistor (5) are arranged between the current supply and current discharge lines (4), the one lighting element (1) and the one surface series resistor (5) of a series connection as well the series connections and the current supply and current discharge line (4') are connected to one another by conductor paths (5), and a stabilizing coating (6) is arranged on the lighting elements (1) for stabilization and for mechanical fixing thereof and also covers regions of connections (7) of the lighting elements (1) and of connection contact faces (8), but leaves the light-emitting front side of the lighting elements (1) free.

9. A flat lighting device comprises light-emitting lighting elements arranged on a carrier, which are connected to current supply and current discharge lines to supply current, the carrier has the form of a metallic sheet (2), which is covered with an insulating layer (3), on which series connections of one lighting element and one surface series resistor (5) are arranged between the current supply and current discharge lines (4'), the one lighting element (1) and the one surface series resistor (5) of a series connection as well as the series connections and the current supply and current discharge lines (4') are connected to one another by conductor paths (4), and a stabilizing metallic composite part (14) is fastened to the side of the metallic sheet (2) remote from the lighting elements (1).

10. The lighting device according to claim 9, wherein the composite part (14) is honeycombed.

11. The lighting device according to claim 9, wherein the composite part consists of aluminum.

12. The lighting device according to claim 11, wherein a cover (15) is fastened to the side of the lighting device opposing the composite part (14).

13. The lighting device according to claim 12, wherein the cover (15) consists of a transparent or opaque material.

14. The lighting device according to claim 13, wherein the cover (15) consists of a plastics material.

15. The lighting device according to claim 12, wherein a cover (15) is fastened to the side of the lighting device opposing the composite part (14).

* * * * *